United States Patent [19]

Scott

[11] Patent Number: 5,079,441

[45] Date of Patent: Jan. 7, 1992

[54] INTEGRATED CIRCUIT HAVING AN INTERNAL REFERENCE CIRCUIT TO SUPPLY INTERNAL LOGIC CIRCUITS WITH A REDUCED VOLTAGE

[75] Inventor: David B. Scott, Plano, Tex.

[73] Assignee: Texas Instruments Incorporated, Dallas, Tex.

[21] Appl. No.: 286,595

[22] Filed: Dec. 19, 1988

[51] Int. Cl.$^5$ ............ G05F 1/56; H03K 3/013; H03K 17/16; H02H 3/22

[52] U.S. Cl. ............ 307/296.1; 307/296.8; 307/585; 307/451; 357/23.13; 361/56; 361/91; 323/312

[58] Field of Search ............ 307/451, 585, 576, 579, 307/296.1, 296.6, 296.8, 304; 357/23.13; 361/56, 58, 91; 323/313, 311, 286, 312

[56] References Cited

U.S. PATENT DOCUMENTS

| | | | |
|---|---|---|---|
| 3,700,981 | 10/1972 | Masuhara et al. | 317/235 R |
| 3,757,200 | 9/1973 | Cohen | 323/8 |
| 4,152,716 | 5/1979 | Torii et al. | 357/41 |
| 4,280,089 | 7/1981 | van de Plassche et al. | 323/354 |
| 4,282,556 | 8/1981 | Ipri | 357/23.13 X |
| 4,318,040 | 3/1982 | Hilbourne | 307/304 X |
| 4,477,736 | 10/1984 | Onishi | 307/296.6 |
| 4,477,737 | 10/1984 | Ulmer et al. | 307/297 |
| 4,532,467 | 7/1985 | Mensink et al. | 323/316 |
| 4,638,184 | 1/1987 | Kimura | 307/296.8 |
| 4,641,081 | 2/1987 | Sato et al. | 323/313 |
| 4,663,584 | 5/1987 | Okada et al. | 307/296.8 X |
| 4,675,557 | 6/1987 | Huntington | 307/475 |
| 4,694,199 | 9/1987 | Goetz | 307/297 |
| 4,745,305 | 5/1988 | Crafts | 307/465 X |
| 4,788,455 | 11/1988 | Mori et al. | 307/296.8 |
| 4,833,342 | 5/1989 | Kiryu et al. | 307/296.8 X |
| 4,837,460 | 6/1989 | Uchida | 307/296.8 |

OTHER PUBLICATIONS

Fink et al., *Electronics Engineers' Handbook*, pp. 16-15 through 16-19, 1982.

*Primary Examiner*—Stanley D. Miller
*Assistant Examiner*—David R. Bertelson
*Attorney, Agent, or Firm*—Raymond E. Fritz; James T. Comfort; Melvin Sharp

[57] ABSTRACT

A bipolar/CMOS integrated circuit uses an on-chip amplifier to provide an intermediate voltage supply (18) to two groups of small geometry CMOS circuits. Bipolar devices (24) may use a full five volts from the outside supply rails (12, 14).

15 Claims, 1 Drawing Sheet

INTEGRATED CIRCUIT HAVING AN INTERNAL REFERENCE CIRCUIT TO SUPPLY INTERNAL LOGIC CIRCUITS WITH A REDUCED VOLTAGE

TECHNICAL FIELD OF THE INVENTION

This invention relates in general to integrated circuits, more particularly to a MOS transistor integrated circuit having reduced voltages.

BACKGROUND OF THE INVENTION

Present day CMOS integrated circuits use a 5 volt power supply. As the size of the CMOS devices are reduced, the voltage that the device can tolerate is similarly reduced. Consequently, a smaller power supply voltage will be needed to accommodate the smaller CMOS devices.

In order to maintain compatibility with CMOS integrated circuits using a 5 volt power supply, as well as other technologies such as bipolar and ECL, it is desirable that the new CMOS integrated circuits also use a 5 volt power supply at its external pins. Internally, however, it is necessary to provide a smaller voltage, such as 2.5–3.0 volts for the CMOS devices.

One alternative is to use an on-chip voltage regulator which is powered by 5 volts and outputs a smaller voltage, such as 2.5 volts. Such an arrangement is inefficient since the excess voltage would be dissapated as heat, and is therefore undesirable from both a power and a reliability standpoint.

Therefore, a need has arisen in the industry to provide an integrated circuit having a 5 volt power supply input which efficiently supplies the CMOS devices comprising the integrated circuit with a reduced voltage.

SUMMARY OF THE INVENTION

In accordance with the present invention, an integrated circuit and method of forming the same is provided which substantially eliminates problems associated with integrated circuits incorporating low voltage circuit blocks.

The integrated circuit of the present invention provides first and second voltage supply rails, typically biased at 0 and 5 volts, respectively. CMOS circuit blocks are connected in series between the first and second supply rails with an intermediate supply rail connected between the circuit blocks. Hence, each pair of circuit blocks receives the 5 volts across the first and second supply rail, one circuit block receiving a voltage equal to the potential between the first supply rail and the intermediate supply rail and the second circuit block receiving a voltage equal to the potential between the intermediate supply rail and the second supply rail. An amplifier is connected between the first and second supply rails to supply current to the intermediate supply rail in order to maintain the voltage thereon a predetermined intermediate voltage.

The present invention provides the technical advantage that devices requiring a reduced voltage may be used on an integrated circuit which receives conventional voltage supplies to be consistent with other integrated circuits on the circuit board. The present invention is more efficient than a on-chip voltage regulator, which would dissipate power at a 5 volt level, while performing at a 2.5 (or other intermediate) volt level.

BRIEF DESCRIPTION OF THE DRAWINGS

For a more complete understanding of the present invention and the advantages thereof, reference is now made to the following description now taken in conjunction with the accompanying drawings in which.

DETAILED DESCRIPTION OF THE INVENTION

Figure 1:
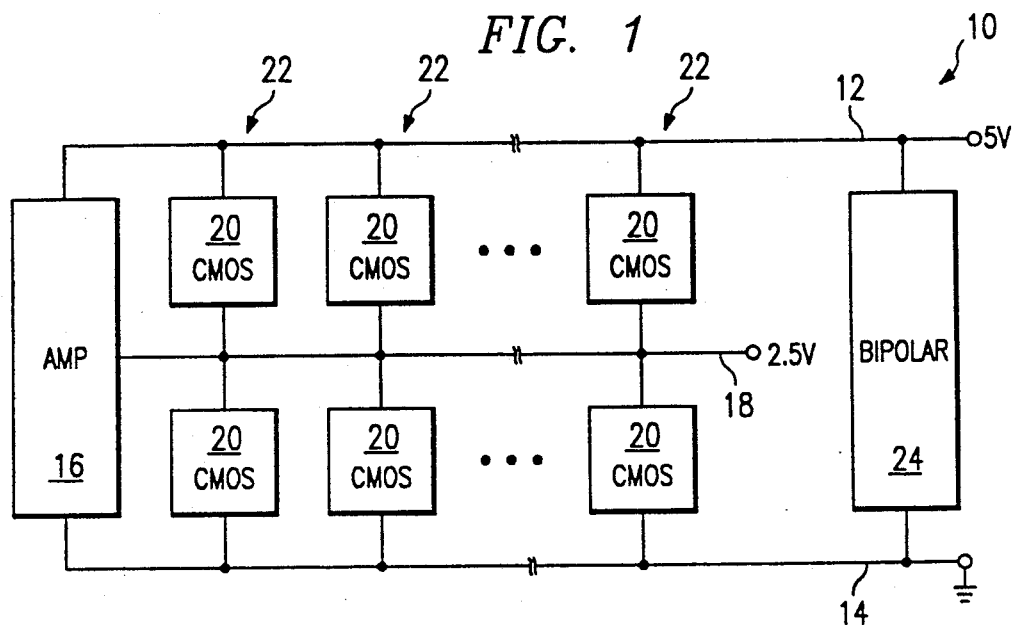
FIG. 1 illustrates a block diagram of a circuit using the present invention.
Figure 2:
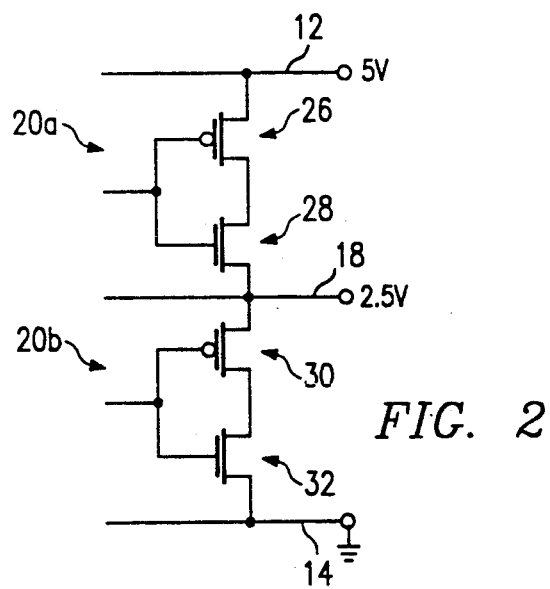
FIG. 2 illustrates a circuit diagram of two CMOS circuit blocks connected between the voltage supply rails and the intermediate supply rail.

The preferred embodiment of the present invention is best understood by referring to FIGS. 1-2 of the drawings, like numerals being used for like and corresponding parts of the various drawings.

FIG. 1 illustrates a block diagram of an integrated circuit using low voltage CMOS devices. The integrated circuit 10 receives its voltage from a 5 volt (relative to ground) voltage supply rail 12 and a ground voltage supply rail 14. Amplifier 16 is connected between the voltage supply rails 12 and 14 and is connected to a 2.5 volt supply rail 18. Low voltage CMOS circuits 20 are grouped in pairs 22 of serially connected circuits 20 such that each CMOS pair 22 is connected across the voltage supply rails 12 and 14. Hence, each CMOS circuit pair 22 receives 5 volts. The 2.5 volt supply rail 18 is connected between the CMOS circuits 20 comprising each circuit pair 22. Bipolar circuits 24 are connected across the voltage supply rail 12 and 14.

In operation, each CMOS circuit pair 22 receives a voltage of 5 volts. The 2.5 volt supply rail 18 is maintained at 2.5 volts by the amplifier 16 which supplies the unbalanced current to the 2.5 volt supply rail 18. Hence, each of the CMOS circuits 20 individually, receives 2.5 volts.

FIG. 2 illustrates a circuit diagram of two low voltage CMOS circuits 20a and 20b as used in the integrated circuit 10 of the present invention. The first CMOS circuit 20a, an inverter, comprises a PMOS transistor 26 and NMOS transistor 28. The PMOS transistor 26 has a first source/drain connected to the 5 volt supply rail 12 and a second source/drain connected to a source/drain of the NMOS transistor 28. The other source/drain of the NMOS transistor 28 is connected to the 2.5 volt supply rail 18. The second CMOS device 20b could also comprise a PMOS transistor 30 and an NMOS transistor 32. The PMOS transistor 30 has a first source/drain connected to the 2.5 volt supply rail 18 and a second source/drain connected to a source/drain of the NMOS transistor 32. The other source/drain of the NMOS transistor 32 is connected to the ground supply rail 14.

For purposes of illustration, CMOS circuits 20a-b are shown as inverters. These circuits are shown for exemplary purposes; more complicated circuits could be similarly implemented as would be understood by one skilled in the art.

In each CMOS circuit pair 22, one of the CMOS circuits 20 will have an NMOS transistor with a 2.5 volt backgate bias. Consequently, the N channel devices on opposite sides of the 2.5 volt supply rail 18 may have to be fabricated differently. Two alternative schemes may be used to compensate for the 2.5 volt backgate bias. The simplest compensation technique is to adjust the threshold voltage of one NMOS device differently than the other. The second compensation technique is to isolate each NMOS device in a P-well by using a buried N+diffusion such that each NMOS transistor sits in its own P-well. The P channel devices do not suffer from the same problem, since each P channel device typically sits in its own N-well.

It should be noted that while the preferred embodiment shows a 2.5 volt supply rail 18, this intermediate supply rail could be held at any voltage between 0 and 5 volts, as desired. For example, the supply rail 18 could be held at 3 volts, providing for 2 volt CMOS devices to be implemented between the intermediate supply rail 18 and the 5 volt voltage supply rail 12 and 3 volt CMOS devices being implemented between the ground supply rail 14 and the intermediate supply rail 18.

The present invention provides the technical advantage that CMOS circuits may be operated at reduced voltages, thereby avoiding hot electron effects, without the need for an on-chip regulator. On-chip regulators are undesirable, since they dissipate power at a 5 volt level, while providing the performance of a reduced supply.

It should be noted that while the present invention has been discussed in connection with 0 and 5 volt external voltage supplies, the concepts embodied in the invention would be useful regardless of the actual external voltages used. It should also be noted that a plurality of intermediate supply rails 18 could be used to split the voltage from the outside supply rails 12 and 14 into more than two increments.

Although the present invention has been described in detail, it should be understood that various changes substitutions and alterations can be made herein without departing from the spirit and scope of the invention as defined by the appended claims.

What is claimed is:

1. An integrated circuit including a plurality of circuits comprising:
   a first supply rail at a first predetermined voltage;
   a second supply rail at a second predetermined voltage;
   an intermediate supply rail at an intermediate voltage between said first and second predetermined voltages;
   an amplifier connected between said first and second supply rails for supplying current to said intermediate supply rail to maintain the voltage thereof at said intermediate voltage;
   a first logic circuit connected and biased between said first supply rail and said intermediate supply rail, wherein said first logic circuit comprises an input and an output; and
   a second logic circuit connected and biased between said intermediate supply rail and said second supply rail, wherein said second logic circuit comprises an input and an output.

2. The integrated circuit of claim 1 wherein said first supply rail is connected to ground, said second supply rail supplies a voltage of 5 volts above ground, and said intermediate supply rail supplies 2.5 volts above ground.

3. The integrated circuit of claim 1 wherein said first and second logic circuits each comprise a plurality of circuits.

4. The integrated circuit of claim 1 further comprising a third circuit connected and biased between said first supply rail and said second supply rail.

5. The integrated circuit of claim 3 wherein said first and second logic circuits each comprise NMOS and PMOS transistors.

6. The integrated circuit of claim 5 wherein said PMOS transistors in said first logic circuit have a separate P-well from the PMOS transistors in said second logic circuit.

7. The integrated circuit of claim 5 and further comprising bipolar devices connected between said first and second supply rails.

8. The integrated circuit of claim 5 wherein the threshold voltages of the NMOS transistors of said first logic circuit have different threshold voltage adjustments than the NMOS transistors of said second logic circuit in order to compensate for backgate bias.

9. The integrated circuit of claim 5 wherein the NMOS transistors for the first logic circuit are isolated in a separate P-well from the NMOS transistors in the second logic circuit.

10. A method of supplying voltage to a plurality of circuit blocks on an integrated circuit comprising the steps of:
    applying a first predetermined voltage across a first circuit block having an input and an output;
    applying a second predetermined voltage across a second circuit block having an input and an output; and
    providing an intermediate supply rail between said first and second circuit blocks such that said intermediate supply rail provides the low voltage supply rail for the first circuit block and the high voltage supply rial for the second circuit block.

11. The method of claim 10 wherein said first predetermined voltage equals said second predetermined voltage.

12. The method of claim 10 wherein said circuits in the circuit blocks comprise CMOS circuits comprising NMOS and a PMOS transistors.

13. The method of claim 12 and further comprising the step of providing different threshold voltages for the NMOS transistors in each circuit to compensate for backgate bias.

14. The method of claim 12 and further comprising the step of providing a separate P-well for the NMOS transistors in each circuit.

15. An integrated circuit formed by the process of claim 10.

* * * * *